United States Patent
Larsson et al.

(10) Patent No.: US 6,898,281 B1
(45) Date of Patent: May 24, 2005

(54) SYSTEM AND METHOD FOR FILTERING ECHO/NEXT SIGNAL INTERFERRENCE

(75) Inventors: Patrik Larsson, Matawan, NJ (US); Christopher John Nicol, Springwood (AU)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/477,910

(22) Filed: Jan. 5, 2000

(51) Int. Cl.[7] .................. H04M 1/00; H04M 9/00; H04M 9/08
(52) U.S. Cl. .............. 379/406.06; 379/406.08; 370/286
(58) Field of Search ............... 708/319, 620, 708/625–632; 379/406.01–406.16; 370/286–291; 375/348, 350, 346, 254, 285

(56) References Cited

U.S. PATENT DOCUMENTS

| | | | |
|---|---|---|---|
| 5,053,984 A | | 10/1991 | Cavallotti et al. |
| 5,570,423 A | * | 10/1996 | Walker et al. ......... 379/406.09 |
| 5,594,677 A | | 1/1997 | Golla et al. |
| 5,664,011 A | * | 9/1997 | Crochiere et al. ..... 379/406.08 |
| 5,724,395 A | * | 3/1998 | Golla et al. .................. 375/350 |
| 6,260,053 B1 | * | 7/2001 | Maulik et al. .............. 708/313 |

* cited by examiner

*Primary Examiner*—Duc Nguyen
*Assistant Examiner*—Alexander Jamal

(57) ABSTRACT

A system and method for echo and near end cross talk (E/N) cancellation in a communications system using a pair of FIR filter ICs, wherein a first FIR filter IC filters a plurality of low amplitude E/N signals and a first portion of a plurality of data bits of a plurality of high amplitude E/N signals, and a second FIR filter IC filters a second portion of the data bits of the high amplitude E/N signals which cannot be filtered by the first FIR filter IC. The output values from the two filters are then summed to produce the E/N cancellation signal. The present invention allows for the use of lower bit-resolution, lower power consumption, and less expensive filter ICs than conventional FIR filters implemented in a single IC.

22 Claims, 3 Drawing Sheets

SYSTEM AND METHOD FOR FILTERING ECHO/NEXT SIGNAL INTERFERRENCE

FIELD OF THE INVENTION

The present invention pertains to the field of filters, and more particularly to finite impulse response (FIR) filters used for echo cancellation in communication systems.

BACKGROUND OF THE INVENTION

Conventional communications systems in which signals are transmitted through a cable have two principal types of signal interference. The first type of signal interference is an echo signal, in which a portion of a transmitted signal is reflected back toward the source of the signal. Such interference is caused by impedance mismatches associated with lumped elements of the system such as connectors and termination circuitry. The second type of signal interference is near end cross talk interference (NEXT) which is usually found in full-duplex bi-directional communications systems having a transmitter and a receiver coupled to a single wire of the cable and is generated across impedances in the cable and by the transmitter.

These echo/NEXT (E/N) interference signals are typically comprised of a few high energy echo signals and a large number of lower energy NEXT signals. Various cancellation techniques are currently used to eliminate these types of interference. See "The Bell System Technical Journal," Vol. 59, No. 2, February 1980, pp. 149–159 and *Data Communication Principles*, R. R. Gitlin et al, pp 607625.

When E/N cancellation (E/NC) methods are implemented in hardware as integrated FIR filters, a negative image for each one of the plurality of echo/Next (E/N) signals is digitally created from the transmitted signal, which is then summed with a received signal. FIR filters employ a plurality of taps in a delay line, wherein each tap is coincident with a particular interference signal. Unique multiplicand coefficients associated with each tap provide weighting to the time-sampled signals, and the plurality of weighted samples are summed to attain the desired filtered cancellation signal.

Conventional systems and methods for digitally filtering signals in the manner described above suffer from significant drawbacks. Specifically, such systems and methods employ a single FIR filter IC for filtering both low amplitude and high amplitude signals. However, filtering high bit resolution signals requires wide data paths which occupy large surface areas and consume large amounts of power thereby increasing the fabrication and operating costs of such devices. Moreover, since the bit resolution, chip surface area, and power dissipation of all of the filters in a conventional FIR filter IC are identical and are designed to filter the highest amplitude E/N signal being filtered by the IC, using such devices to filter low amplitude signals is not cost effective or efficient from a performance standpoint.

SUMMARY OF THE INVENTION

We have developed in accordance with the principles of the invention a system and method for echo and near end cross talk (E/N) cancellation in a communications system using a pair of FIR filter ICs. The first FIR filter IC filters a plurality of low amplitude E/N signals and a first portion of a plurality of data bits of a plurality of high amplitude E/N signals, and the second FIR filter IC filters a second portion of data bits of the high amplitude E/N signals. The first portion of data bits of the high amplitude E/N signals comprises a certain number of least significant bits (LSBs) which are filtered by the first FIR filter IC, and the second portion of the high amplitude E/N signals comprises a certain number of most significant bits (MSBs) which cannot be filtered by the first FIR filter IC but are filtered by the second FIR filter IC. The output values from the two filters are then summed to produce the E/NC signal.

The bit resolution of the two FIR filter ICs is lower than the bit resolution which would be required to describe the largest signal in the E/N response. This allows for the use of lower bit-resolution, lower power consumption, and less expensive filter ICs than the conventional FIR filters implemented in a single IC.

DETAILED DESCRIPTION OF THE DRAWINGS

Figure 1:
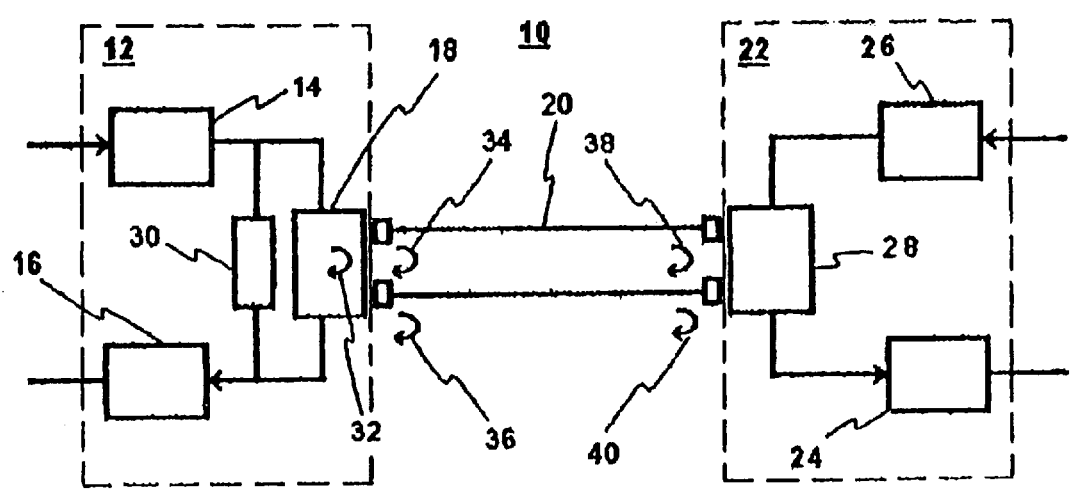
FIG. 1 shows the energy reflection and leakage paths of a communications system of the present invention.

The present invention is for a method and system for eliminating echo and near end crosstalk interference in conventional communications systems using FIR filters. FIG. 1 shows the energy reflection and leakage paths of a communications system 10 according to the present invention, wherein a local circuit 12 includes a transmitter 14 and a receiver 16 which are both coupled to a switchable port 18 which is in turn coupled to transmission cable 20. System 10 also includes a remote circuit 22 coupled to cable 20 which is comprised of a remote receiver 24 and a remote transmitter 26 which are both coupled to a terminating port 28 with cable connectors. Depending on the application for which system 10 is used, one or more circuits 22 can be used, each one having different combinations of transmitter 26 and receiver 24.

Port 18 electrically isolates local receiver 16 from cable 20 while local transmitter 14 transmits data over cable 20. Port 18 also isolates local transmitter 14 from cable 20 while data is transmitted over cable 20 from remote transmitter 26. Transmitter 14 transmits data and receiver 16 receives data simultaneously over cable 20. An E/NC circuit 30 is included as part of circuit 12 and generates an E/N cancellation signal from a data signal transmitted by transmitter 14. This E/NC signal negates any corresponding E/N interference signal generated by transmission of the data signal through port 18 and over transmission cable 20. Thus, a data signal at the input of receiver 16 includes none of the E/N interference signals. E/NC circuit-30 is comprised of two FIR filters ICs, which are each comprised of a plurality of FIR filters described below and shown in FIGS. 3–5. Each one of the plurality of FIR filters is comprised of a plurality of filter elements.

Echo path 32 represents the internal E/N signal paths in circuit 12 from transmitter 14 to receiver 16 caused by parasitics associated with the interconnection of circuit boards of circuit 12 and the mirroring effects of the cable connectors at the port 18. Various other signal reflection and leakage paths are shown, i.e., crosstalk path 34 and echo path 36 which are generated by the near-end parasitics of cable 20, and crosstalk path 38 and echo path 40 which are generated by the far-end parasitics of cable 20 and the combination of the plurality of termination elements of circuit 22. Each of the E/N signals which are propagated along these paths are attenuated by the length of the paths traversed to receiver 16, with the more distant signals being more attenuated.

Figure 2:
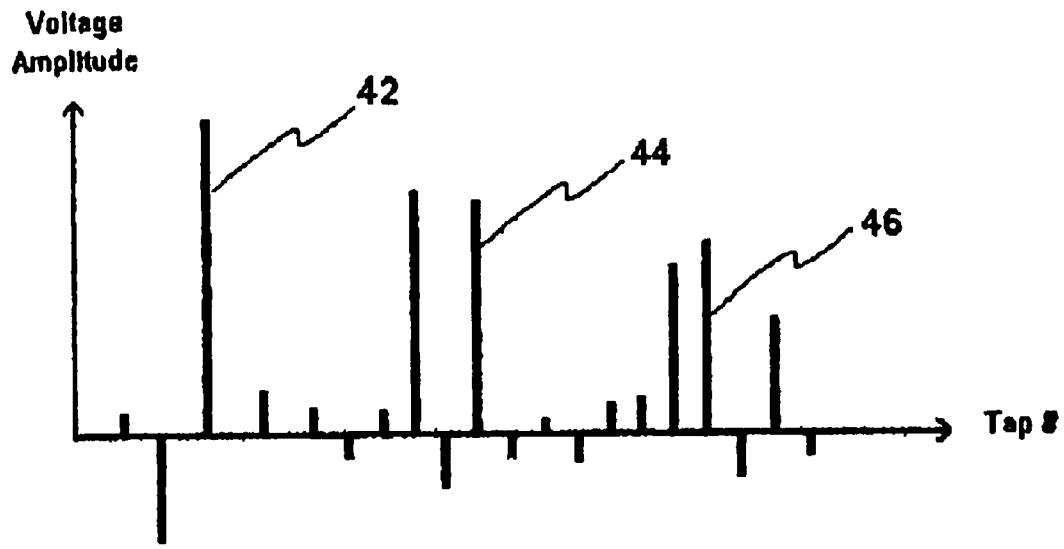
FIG. 2 shows a plot of signal voltage amplitude in volts vs. tap number of the primary E/N signals shown in FIG. 1.

FIG. 2 shows a plot of signal voltage amplitude in volts vs. Tap number of the primary E/N signals shown in FIG. 1. The amplitude of the largest of these signals determines the bit resolution of the elements comprising the FIR filters used in circuit 30. For example, if it assumed that E/N signal 42, which results from internal noise and reflection path 32 of circuit 12, is of sufficient amplitude to require 14 data bits to be accurately described within a given tolerance level, a FIR filter would have to provide 14 bit width data paths to accurately filter a sampled data word. Lower amplitude E/N signals require lower bit resolution. Typically, more than one E/N signal is associated with each lumped element, i.e., a plurality of wires, connectors, and/or ports.

FIG. 2 also shows the relative voltage amplitudes of the plurality of near E/N signals shown in FIG. 1. E/N signal component 44 represents a signal that propagates along path 34 shown in FIG. 1, and E/N signal component 46 represents a signal that propagates along path 36 shown in FIG. 1. E/N signal components 42, 44 and 46 can be components of either a Next signal or an echo signal, with each component having a different source, e.g., a different connector. 44 and echo signal 46 are components of the same signal. The signal amplitudes shown in FIG. 2 are exemplary only, and may differ with various circuit topologies and different components that might vary E/N signal strength.

Figure 3:
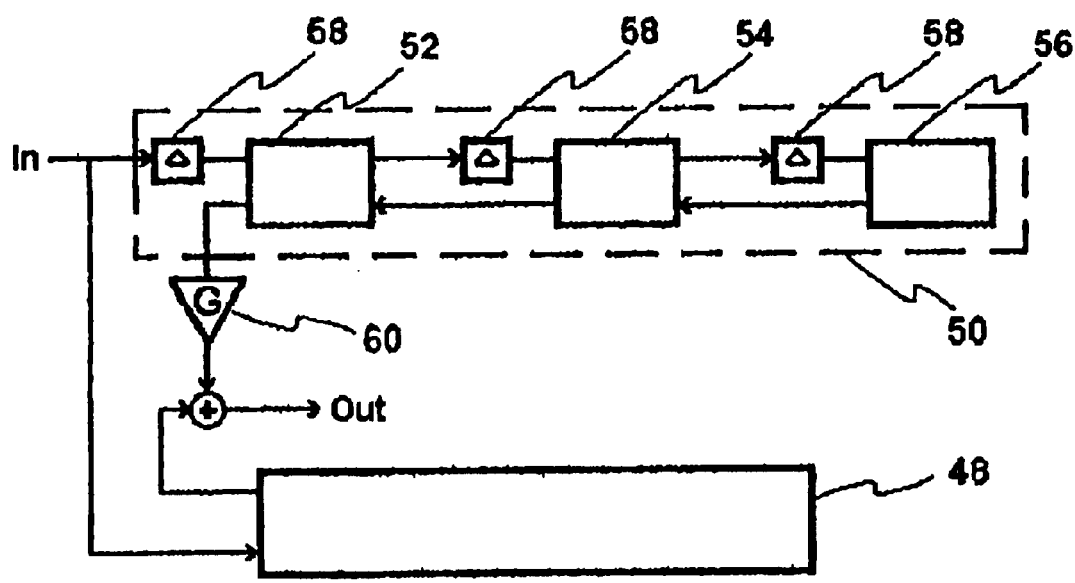
FIG. 3 shows an exemplary embodiment of the FIR filter ICs of the present invention as they are implemented with the E/N signals shown in FIGS. 1–2.

FIG. 3 shows an exemplary embodiment of the FIR filter ICs of the present invention as they would be implemented using the E/N signals shown in FIGS. 1–2. A first FIR filter IC 48 is comprised of a plurality of lower bit-resolution FIR filters which process all of the data bits of a plurality of low amplitude signals and a portion of the data bits of a plurality of high amplitude signals, such as the three larger signals 42, 44 and 46 shown in FIG. 2. A second FIR filter IC 50 is comprised of three FIR filters 52, 54 and 56, which each process the portions of the data bits of high amplitude signals 42, 44 and 46, respectively, which are not processed by the first FIR filter IC.

If it is assumed the data path widths for the low resolution signals are eight bits wide, the 14 bit width data word of exemplary E/N signal 42 can be partitioned into an 8-bit and a 6-bit data word which are filtered by FIR filter ICs 48 and 50, respectively. The eight LSBs of E/N signal 42 can be processed by first FIR filter IC 48, and the remaining six MSBs can be processed-by second FIR filter IC 50.

Adjustment of propagation delays of each tap signal coupled to FIR filters 52, 54 and 56 is occasionally necessary for proper operation of the cancellation circuitry 30 shown in FIG. 1. This adjustment can be accomplished by using adaptively tunable delta-delays 58, wherein each tunable delay 58 is associated with one of FIR filters 52, 54 and 56. Alternatively, these adaptive delays can be implemented as register files, which are not shown, and are included in FIR filters 52, 54 and 56.

The configuration of the FIR filters comprising FIR filter ICs 48 and 50, respectively, need not be the same. Specifically, in FIR filter IC 50, FIR filter 52 can be in direct form while FIR filters 54 and 56 can be in transpose form. A gain stage 60 can be implemented as a simple shift register to achieve correct bit alignment between the filter elements of first FIR filter IC 48 and the filter elements of second FIR filter IC 50.

Figure 4:
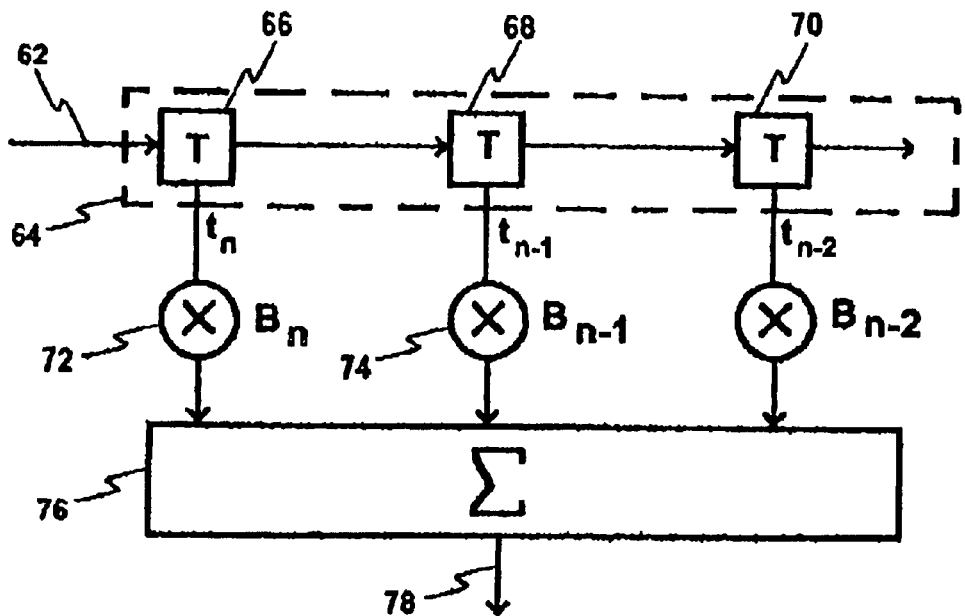
FIG. 4 shows a tap arrangement used in each FIR filter shown in FIG. 3.

FIG. 4 shows a tap arrangement used in FIR filters 52, 54 and 56 shown in FIG. 3, wherein transmitted signal 62 is applied to a delay line 64, and time-delayed samples of signal 62 are obtained at taps 66, 68 and 70 residing on delay line 64. The operation of FIR filters, such as FIR filters 52, 54 and 56 shown in FIG. 3, are characterized by summing of a present signal sample with the weighted values of previous samples of the same signal. Since signal 62 propagates along delay line 64 over time, by providing taps at different locations along delay line 64, a plurality of samples of the delayed signal are available at any sampling instant. Each of these samples are multiplied by a unique weighting coefficient and then summed to produce the filtered value using the following transfer equation $$C_m(f) = \sum_{-N}^{N} B_n e^{-j2\pi f \tau} \tag{1}$$

where $C_m(f)$ is the filtered result of a given filter, $e^{-j2\pi f \tau}$ is the sinusoidal signal sampled at time $\tau$, $B_n$ is the weighting coefficient for the nth sample, and the number of delay samples at the filter taps is 2N+1 (−N to +N).

After signal 62 propagates along delay line 64, an instantaneous sampling of all the taps will produce a present time sample at tap 66, a previous time sample at tap 68, and a next previous time sample at tap 70. Each one of these samples is multiplied by the unique weighting coefficient associated with each particular tap. For example, the signal from tap 66 is multiplied in multiplier 72 by weighting coefficient $B_n$, the signal from tap 68 is multiplied in multiplier 74 by weighting coefficient $B_{n-1}$, and so on. The plurality of products of each tap chain are then summed in a mathematical adder 76 to produce a single filtered signal 7B. Either fixed or floating point numbers can be used for the above operations.

Figure 5:
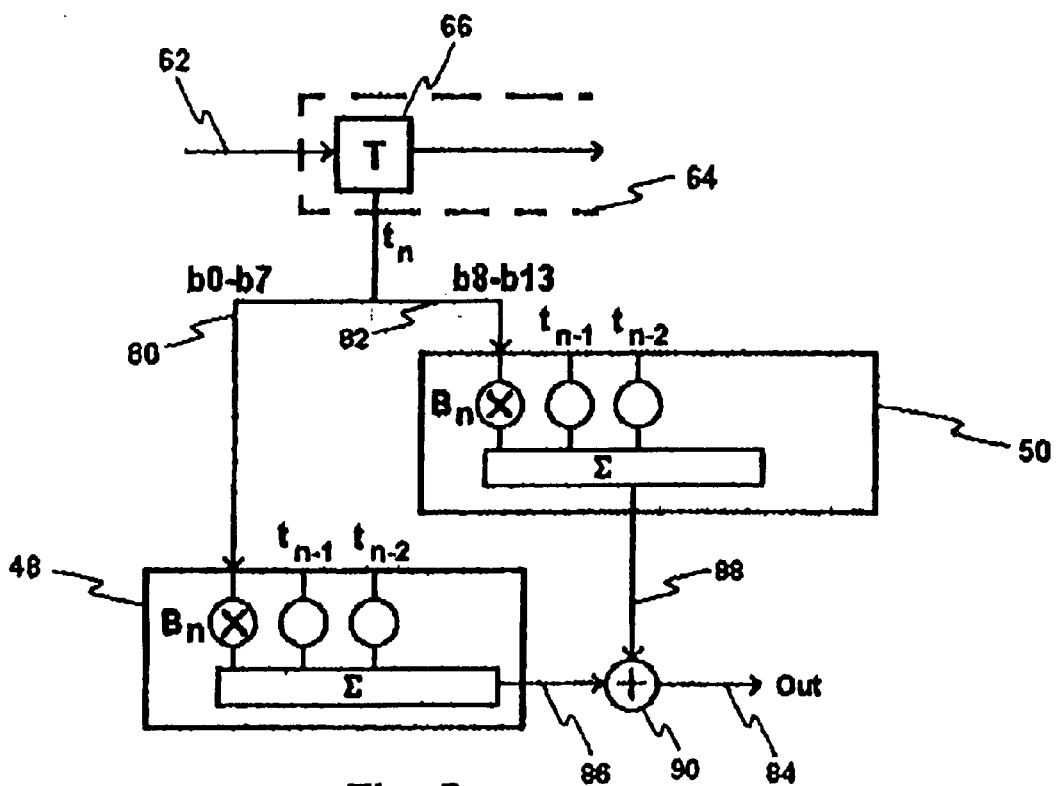
FIG. 5 shows the bit partitioning performed by one of the taps shown in FIG. 4.

FIG. 5 shows the bit partitioning performed by one of the taps shown in FIG. 4. Specifically, a sampled data word of input signal 62 at tap 66 of delay line 64 is partitioned with the LSBs 80 of the sampled data word being processed by first FIR filter IC 48 and the MSBs 82 of the sampled data word being processed by second FIR filter IC 50. If it is assumed that the eight LSBs of the 14 bit sampled data words associated with any one of the exemplary FIR filters 52, 54 and 56 shown in FIG. 3 are processed by first FIR filter IC 48, and the six MSBs of the sampled data words of FIR filters 52, 54 and 56 are processed by second FIR filter IC 50, first FIR filter IC 48 can be implemented as an 8-bit IC and second FIR filter IC 50 can be implemented as a 6-bit IC rather than all of the plurality of FIR filters of being implemented in a single expensive 14-bit IC. Alternatively, the partitioning can be implemented using any other combination of filter ICs, such as a 10-bit device and a 4-bit device, respectively. A final FIR output 84 is obtained by combining output 86 from FIR filter IC 48 and output 88 from FIR filter IC 50 at summing node 90.

Several methods can be used to partition a data signal using at least two FIR filter ICs according to the present invention. One method comprises the steps of determining from the plurality of E/N signals both a first bit resolution that describes at least a majority of the lowest amplitude EIN signals, and a second bit resolution that describes a single E/N signal having the highest amplitude. The first FIR filter IC is selected to have the first bit resolution and incorporates an LSB portion of all of the E/N signals. The second FIR filter IC is selected to have a bit resolution that is equal to the difference between the second and first bit resolutions, such that the second FIR filter IC can filter any data bits of E/N signals that cannot be filtered by the first FIR filter IC.

A second method for partitioning data using the techniques described above is to halve the bit resolution that describes a single E/N signal having the highest amplitude to thereby obtain identical first and second bit resolutions. Thus, the data bits of higher amplitude signals can be evenly partitioned between the two FIR filter ICs, with the bits of the lower amplitude E/N signals being entirely filtered by the first FIR filter IC.

The number of lowest amplitude signals included in the aforementioned determination of the first bit resolution is controlled by the design criteria of the entire communications system, but should include at least half of all the signals to be filtered to insure that a representative first bit resolution is determined. Alternatively, inclusion of three-fourths of all the signals can be a requirement for the first bit resolution determination.

Partitioning data signals according to the present invention allows a plurality of smaller, less expensive filters to be used to filter Echo/NEXT interference signals than a single conventional FIR filter used to filter such interference signals. This results in reductions in cost, IC chip size, and power dissipation compared to conventional filters.

The present invention can be used for applications other than data applications, such as voice applications.

Numerous modifications to the alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the claims is reserved.

What is claimed is:

1. An echo/near-end-crosstalk cancellation system for a bi-directional data communications system comprising:
    a first finite impulse response filter configured to filter a first portion of a digital representation of a data signal comprising data, low amplitude echo/near-end-crosstalk components and high amplitude echo/near-end-crosstalk components, the first portion comprising bits representing the low amplitude echo/near-end-crosstalk components of the data signal and least significant bits of the high amplitude echo/near-end-crosstalk components of the data signal;
    a second finite impulse response filter coupled to the first finite impulse response filter, said second finite impulse response filter configured to filter a second portion of said digital representation of the data signal, said second portion comprising most significant bits of said high amplitude echo/near-end-crosstalk components;
    a data partitioning means for partitioning said digital representation of the data signal into said first and second portions such that said first portion is processed by the first finite impulse response filter to provide a first filter output value, and said second portion is processed by the second finite impulse response filter to provide a second filter output value; and
    a combination means for summing the output values from the first and second filters to produce a digital representation of the low and high amplitude echo/near-end-crosstalk components, and subtracting said digital representation of the low and high amplitude echo/near-end-crosstalk components from the digital representation of the data signal to provide echo/near-end-crosstalk cancellation.

2. The system according to claim 1, further comprising a control means for adjusting the first and second filter output values.

3. The system according to claim 1, wherein the first finite impulse response filter and the second finite impulse response filter are each implemented as a separate integrated circuit.

4. The system according to claim 1, wherein the first finite impulse response filter is comprised of a plurality of filter elements.

5. The system according to claim 1, wherein the second finite impulse response filter is comprised of a plurality of filter elements.

6. The system according to claim 1, wherein the data partitioning means comprises a plurality of conductors for conducting the first portion of the data signal to the first finite impulse response filter and the second portion of the data signal to the second finite impulse response filter.

7. The system according to claim 6, wherein the second portion of the partitioned data signal negates a second portion of an echo/near-end-crosstalk signal generated as a result of the transmission of the data signal, wherein the second portion of the echo/near-end-crosstalk signal is not included in the first portion.

8. The system according to claim 1, wherein the first and second finite impulse response filters are adaptive type filters.

9. The system according to claim 1, wherein the first and second finite impulse response filters are non-adaptive type filters.

10. The system according to claim 1, wherein the first and second finite impulse response filters are digital filters.

11. The system according to claim 1, wherein both the first and second finite impulse response filters are configured identically in direct form.

12. The system according to claim 1, wherein both the first and second finite impulse response filters are configured identically in transpose form.

13. The system according to claim 1, wherein the first and second finite impulse response filters are configured differently, with one being in direct form and the other being in transpose form.

14. The system according to claim 2, wherein the control means for adjusting the first and second filter output values comprises a multi-tap delay line including a plurality of taps, wherein at least one programmable delay line is interposed between two of the plurality of taps.

15. The system according to claim 2, wherein the control means for adjusting each of the first and second filter output values comprises at least one holding register in each finite impulse response filter for implementing a unique one of a plurality of adaptive delays.

16. The system according to claim 1, wherein the first and second finite impulse response filters filter the data signal using either fixed or floating point numbers.

17. A method for partitioning data words in an echo/near-end-crosstalk cancellation circuit for a communications system, comprising the steps of:
    determining a first bit resolution from a predetermined number of a plurality of echo/near-end-crosstalk (E/N) signals having a lowest amplitude;
    determining a second bit resolution by subtracting the first bit resolution from a bit resolution of a single signal from a plurality of E/N signals having a highest amplitude; and partitioning the plurality of E/N signals such that a first portion is processed by a first FIR filter having a data path identical to the first bit resolution, and a second portion comprised of bits having a data size exceeding the bit width of the first FIR filter is processed by a second FIR filter having a data path identical to the second bit resolution.

18. The method according to claim 17, wherein the predetermined number of signals comprises a majority of the plurality of E/N signals.

19. The method according to claim 18, wherein the predetermined number of signals comprises three quarters of the plurality of E/N signals.

20. A method for partitioning data words in an echo/near-endcrosstalk cancellation circuit for a bidirectional communications system, comprising the steps of:

determining a first bit resolution from a predetermined number of a plurality of echo/near-end-crosstalk signals, said first bit resolution comprising a majority of lowest amplitude echo/near-end crosstalk signals;

determining a second bit resolution by subtracting the first bit resolution from a bit resolution of a single signal of said plurality of echo/near-end-crosstalk signals having a highest amplitude; and partitioning the plurality of echo/near-end-crosstalk signals such that a first portion is processed by a first finite impulse response filter having a data path identical to the first bit resolution, and a second portion is processed by a second finite impulse response filter having a data path identical to the second bit resolution.

21. The method according to claim 20, wherein the predetermined number of signals comprises a majority of the plurality of echo/near-end-crosstalk signals.

22. The method according to claim 21, wherein the predetermined number of signals comprises three quarters of the plurality of echo/near-end-crosstalk signals.

* * * * *